(12) United States Patent
Haines

(10) Patent No.: US 7,463,460 B2
(45) Date of Patent: Dec. 9, 2008

(54) ARC QUENCHING DEVICE FOR A SOLAR ARRAY

(75) Inventor: James Edward Haines, Oegstgeest (NL)

(73) Assignee: European Space Agency, Paris (FR)

( * ) Notice: Subject to any disclaimer, the term of this patent is extended or adjusted under 35 U.S.C. 154(b) by 99 days.

(21) Appl. No.: 10/587,388

(22) PCT Filed: Jan. 26, 2004

(86) PCT No.: PCT/EP2004/000612

§ 371 (c)(1), (2), (4) Date: Apr. 17, 2007

(87) PCT Pub. No.: WO2005/071512

PCT Pub. Date: Aug. 4, 2005

(65) Prior Publication Data

US 2007/0273339 A1 Nov. 29, 2007

(51) Int. Cl.
*H01H 3/00* (2006.01)
*H01L 35/28* (2006.01)
(52) U.S. Cl. .......................................... 361/2; 136/244
(58) Field of Classification Search ................ 361/2; 136/244
See application file for complete search history.

(56) References Cited

U.S. PATENT DOCUMENTS

| | | | | |
|---|---|---|---|---|
| 4,186,336 A | * | 1/1980 | Weinberg et al. | ........... 323/223 |
| 4,232,070 A | * | 11/1980 | Inouye et al. | ................. 428/49 |
| 4,755,231 A | * | 7/1988 | Kurland et al. | ............... 136/244 |
| 4,832,755 A | * | 5/1989 | Barton et al. | ................ 136/251 |
| 5,289,998 A | * | 3/1994 | Bingley et al. | ........... 244/172.7 |
| 6,177,629 B1 | * | 1/2001 | Katz | ........................... 136/244 |
| 6,181,115 B1 | | 1/2001 | Perol et al. | |
| 6,248,950 B1 | * | 6/2001 | Hoeber et al. | ............... 136/251 |

FOREIGN PATENT DOCUMENTS

EP 0938141 A 8/1999

OTHER PUBLICATIONS

A. Meulenberg: "Overview, Testing and Solutions to ESD-induced, Solar-array String, On-orbit Failures" Progress in Photovoltaics Research and Applications, [Online] vol. 8, Jun. 16, 200, pp. 315-321.

* cited by examiner

*Primary Examiner*—Michael J Sherry
*Assistant Examiner*—Lucy Thomas
(74) *Attorney, Agent, or Firm*—Bachman & LaPointe, P.C.

(57) ABSTRACT

A device for protecting against arcing events solar array panels and control equipment supplying a main power bus is provided. The control equipment comprises a regulator for controlling a solar array voltage ($V_s$) and includes a power dump stage for shunting the solar array voltage as a function of a control signal. The device comprises a voltage drop detection circuit for generating a voltage drop detection signal ($V_D$) when a voltage drop is detected in the solar array voltage ($V_s$), and an arc-quenching circuit comprising a system for generating an output signal ($V_o$) which is applied as the control signal to the power dump stage so as to shunt the solar array voltage ($V_s$) when a voltage drop is detected by the voltage drop detection circuit.

7 Claims, 4 Drawing Sheets

ARC QUENCHING DEVICE FOR A SOLAR ARRAY

BACKGROUND OF THE INVENTION

1. Field of the Invention

The present invention relates to solar power sources, their regulators and in particular to a circuit to protect against arcing on solar panels or within the solar array drive mechanism (SADM) of a spacecraft.

2. Description of the Prior Art

Solar array panels of a geostationary telecommunication satellite are maintained in a sunlight configuration by a solar array drive mechanism which rotates the array wings once every 24 hours. In order to transfer the power generated by the solar cells to the satellite on-board electrical system, a slip ring and pick-off brush assembly is incorporated within the solar array drive mechanism. Such a slip ring comprises concentrical conductor rings separated by insulating barriers.

A classical power system of a spacecraft comprises a power regulator for regulating the voltage of the main power bus of the spacecraft. This regulator includes several power dump stages which are used to shunt the excess of solar array current in order to generate a regulated voltage. A power dump stage is disclosed in the U.S. Pat. No. 4,186,336. A functionally equivalent circuit using a more recent technology is shown in FIG. 1. This stage is either in a "Dump ON" or in a "Dump OFF" state controlled by a "DoD" (Dump on Drive) signal. The power dump stage 3 comprises a MOSFET transistor M10 connected between the solar array line and the ground, which shunts the solar array voltage when it is set in its ON state (corresponding to the Dump On state of the stage) by the DoD signal. This stage further comprises two serial blocking diodes D1, D2 inserted in the line linking the solar array and the main power bus, so as to prevent current to flow back from the power bus to the power dump stage or the solar array.

Over recent years, satellite power bus voltages have increased and several cases of power losses have been observed in satellite on-board electrical systems, resulting in a significant degradation of the spacecraft performances. These power losses have been attributed to damage caused by sustained voltage arcing occurring either on a solar array panel or even within the solar array drive mechanism causing the power loss of a full solar array wing. The initiating mechanism of this voltage arcing is usually attributed to some form of contamination. If metallic particles bridge across two electrical conductors (solar cells, slip rings) having a significant potential difference, the initial current flow will likely evaporate the metallic particle. Since classical spacecraft shunt regulators usually comprise two serial blocking diodes (D1, D2) between the solar array and the main power bus, if an arcing event occurs that demands more current than the solar cells can provide, the solar array section voltage will collapse.

After the fusing of the particle, the arc may extinguish, but if sufficient plasma still exists and localized damage has occurred, a sustained arcing event can be initiated. If the latter situation proves to be the case, the extreme heat generated by the arcing event will rapidly degrade any local insulation barrier and quickly results in a permanent short circuit condition, resulting in a permanent power loss for the spacecraft.

The initial arcing potential can be low but as the material of the contact points are eroded away, the arc potential will typically increase.

Although such an arcing event is known to be a rare occurrence, it is essential to prevent such arcing events in order to maintain the performance and required life span of satellites.

SUMMARY OF THE INVENTION

An object of the present invention is to minimize the risk of a significant power loss resulting from failure propagation following an uncontrolled arcing event on the solar array or within the solar array drive mechanism. This object is achieved by a device for protecting against arcing events, solar array panels and control equipment supplying a main power bus, said control equipment comprising a regulator for controlling a solar array voltage and including a power dump stage for shunting said solar array voltage as a function of a control signal.

According to the invention, this device comprises:

a voltage drop detection circuit for detecting a voltage drop in the solar array voltage provided by said solar array panels, said voltage drop detection circuit generating a voltage drop detection signal, and an arc-quenching circuit comprising means for generating an output signal which is applied as said control signal to the power dump stage so as to shunt said solar array voltage when a voltage drop is detected by said voltage drop detection circuit.

According to an aspect of the invention, said arc-quenching circuit further comprises means for shaping said output signal so as to provide a short initial delay without any action subsequent to a voltage drop detection provided by said voltage drop detection signal, and after said initial delay an arc-quenching pulse which triggers said power dump stage so as to shunt said solar array voltage.

According to a further aspect of the invention, said arc-quenching circuit further comprises a first monostable controlling said initial delay and a second monostable controlling the width of said arc-quenching pulse.

According to a further aspect of the invention, said initial delay is set to about 19 ms and said arc-quenching pulse has a width set to about 1.7 s.

According to a further aspect of the invention, said arc-quenching circuit further comprises means for starting a new quenching cycle including said initial delay followed by said arc-quenching pulse as long as the voltage drop detection circuit detects a voltage drop in said solar array voltage.

According to a further aspect of the invention, said voltage drop detection circuit comprises means for comparing said solar array voltage to a main bus voltage.

According to a further aspect of the invention, said arc-quenching circuit further comprises means for combining said control signal and said output signal before being applied to the power dump stage.

The invention will be more clearly understood and other features and advantages of the invention will emerge from a reading of the following description given with reference to the appended drawings.

DETAILED DESCRIPTION OF THE PREFERRED EMBODIMENT

Figure 1:
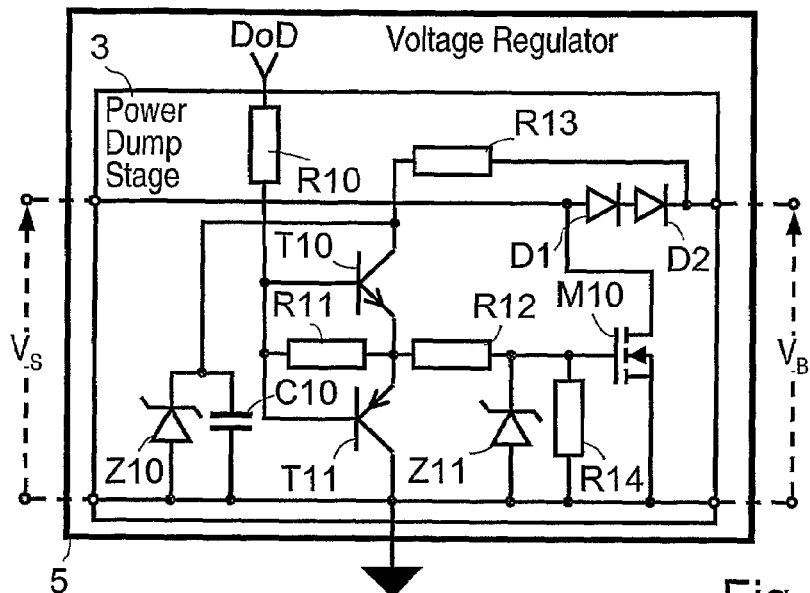
FIG. 1 schematically illustrates a spacecraft solar array voltage regulator including a power dump stage according to prior art.
Figure 2:
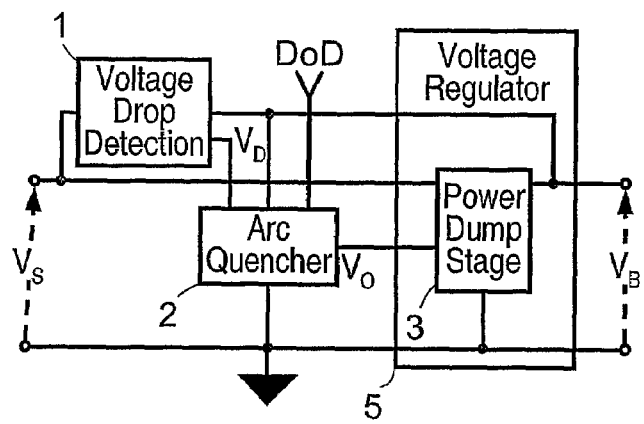
FIG. 2 schematically illustrates a spacecraft solar array regulator equipped with a protection device according to the present invention.

The major characteristics of the invention will now be detailed. FIG. 2 depicts a protection device associated to a voltage regulator 5 including the power dump stage 3 as the one shown in FIG. 1. According to the present invention the protection device comprises a voltage drop detection circuit 1 for detecting a voltage drop caused by an arcing event occurring in the solar array voltage, and an arc-quenching circuit 2 which uses a detection signal provided by the voltage drop detection circuit to generate a pulse which can activate the power dump circuit 3 into the "ON" state for a certain amount of time.

Figure 3:
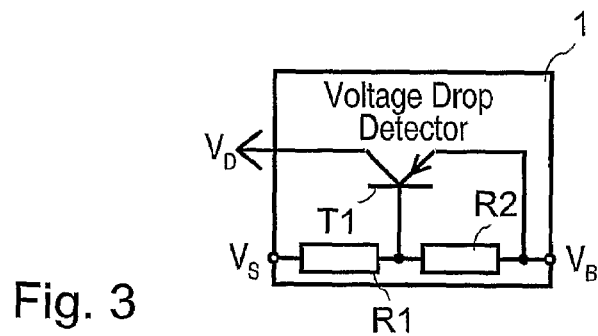
FIG. 3 is a more detailed view of a voltage drop detector circuit of the protection device shown in FIG. 2.

The voltage drop detection circuit 1 is shown in detail in FIG. 3. This circuit comprises a transistor T1 of the type pnp having a base terminal connected to the solar array voltage $V_S$ through a resistor R1 and to the bus voltage $V_B$ through a resistor R2, an emitter terminal connected to the bus voltage and a collector terminal providing a voltage drop detection signal $V_D$. In normal operation, the base voltage of the transistor T1 is reversed biased so that the transistor is non-conducting. Thus, the collector ($V_D$) of the transistor T1 is pulled down to 0 V. When an arc occurs, the solar array voltage drops, resulting in a potential difference between the solar array voltage and the bus voltage which is regulated. If this potential difference is greater than the natural base-emitter junction voltage of the transistor T1 (typically 0.7 V), the transistor T1 conducts and lets a current pass through it. As a result, the voltage drop is detected and the collector current passing through the transistor may be used to operate the power dump stage 3.

For example, R1=470 Ω, R2=4.7 kΩ and T1 is a 2N2907A pnp transistor. Assuming a 50 V power bus voltage $V_B$, with the exception of the voltage drop detection signal, every point in the circuit is around 50 V in normal operation and the base voltage of the transistor is reversed biased by 1.4 V and its collector ($V_D$) is thus at 0 V. When an arc occurs, the solar array voltage $V_S$ can drop to approximately 35 V. Thus the potential difference between the solar array voltage and the bus voltage is approximately of 15 V. The transistor junction being ignored, the voltage drop $V_{R2}$ over resistor R2 is:

$$V_{R2} = (V_B - V_S)\frac{R_2}{R_1 + R_2} = 15 \cdot \frac{470}{5170} = 1.36 \text{ V} \quad (1)$$

Under these conditions, transistor T1 conducts and the voltage drop detection signal $V_D$ at the collector of transistor T1 rises to approximately 11 V.

It should be noted that alternative methods of detecting arcing events may be used. For instance, the loss of current from the solar array section could be the monitored parameter.

Figure 4:
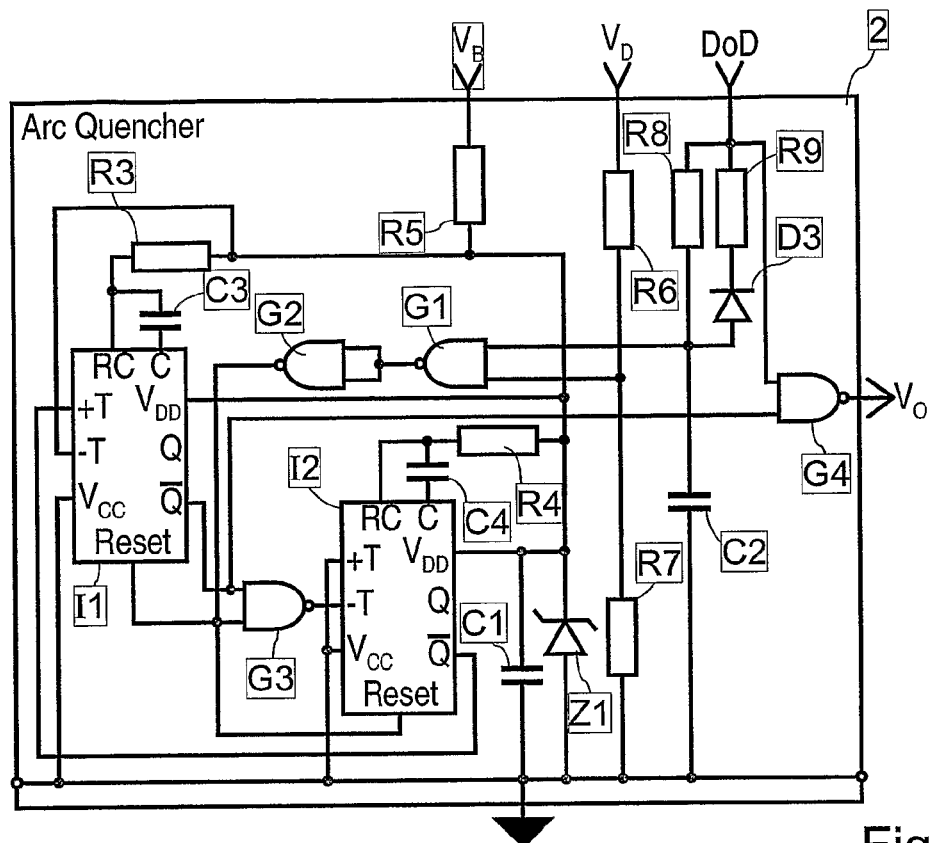
FIG. 4 is a more detailed view of an arc-quenching circuit of the protection device shown in FIG. 2.

The voltage drop detection signal $V_D$ is applied to the arc-quenching circuit 2 shown in detail in FIG. 4. This circuit is preferably designed to allow a short time without any action subsequent to a voltage drop detection, so as to give a chance for a possible short circuit material to evaporate. Then if the short circuit persists, this circuit is designed to quench any resultant arcing by short-circuiting the applied voltage (solar array voltage $V_S$) for a much longer period, using the power dump stage 1.

For this purpose, the arc-quenching circuit 3 comprises a dual monostable multivibrator which receives the voltage drop detection signal $V_D$ as a trigger signal to first trigger an initial short delay and then to generate a long duration pulse which sets the power dump stage 1 into the ON state for a certain amount of time.

In FIG. 4, the arc-quenching circuit 3 includes two monostables I1, I2, each having two terminals RC and C for connecting the monostable to a parallel RC circuit comprising a capacitor C3, C4 connected between the terminals R and RC and a resistor R3, R4 connecting the RC terminal to the supply voltage produced by a resistor R5 and a zener diode Z1 mounted in parallel with a capacitor C1 and connected to the ground. Resistor R5 is chosen so as to provide a suitable current from the bus voltage to stimulate zener diode Z1, for example a 15 V device which is used to supply the monostables through a $V_{DD}$ terminal.

Each monostable I1, I2 further comprises a positive +T and a negative −T trigger terminal for triggering the monostable. The negative trigger terminal of the first monostable I1 is connected to the supply voltage provided by zener diode Z1, whereas the positive trigger terminal of the second monostable I2 is connected to the ground. A signal applied to the negative trigger terminal −T will trigger the monostable only if it goes from high to low and reversely for a signal applied to the positive terminal +T.

Each monostable I1, I2 further comprises a direct output Q and an inverting output $\overline{Q}$, the direct output Q of both the monostables being not used (not connected). The inverting output of the first monostable I1 is connected through a NAND gate G3 to the negative trigger terminal −T of the second monostable I2 and the inverting output of the latter is connected to the positive trigger terminal +T of the first monostable.

Each monostable I1, I2 further comprises a ground terminal connected to ground and a Reset input terminal, the Reset input terminal of the two monostables I1, I2 being connected to the other input of NAND gate G3 and receiving a signal from a NAND gate G1 through another NAND gate G2 mounted as an inverter (both its inputs are connected to the output of gate G1). One input of NAND gate G1 receives through a resistor R6 the voltage drop detection signal $V_D$, the junction point between resistor R6 and gate G1 being connected to the ground through a resistor R7. The other input of gate G1 receives the DoD signal through a resistor R8 connected in parallel with a resistor R9 mounted in series with a diode D3 and is also connected to the ground through a capacitor C2. The DoD signal is also applied as an input to a NAND gate G4 whose other input is connected to the inverting output $\overline{Q}$ of the first monostable I1. The output of gate G4 is an output $V_O$ of the quenching circuit and is used to drive the power dump stage 3 and in particular the MOSFET M10 of this stage.

In a normal state, both the DoD signal and the output $\overline{Q}$ of the first monostable I1 are "high". Thus the output of gate G4 is "low".

When the voltage drop detection circuit 1 detects a voltage drop in the solar array voltage, a voltage of about 11 V is applied to NAND gate G1. Since by definition, the DoD signal applied to the other input of gate G1 is also in high state (no dumping), the gate G1 output then goes from "high" to "low". The output signal of gate G1 is inverted by gate G2 which generates a signal going from "low" to "high", this signal removing the imposed DC reset applied on both monostables I1, I2 and being applied to gate G3. The other input of this gate comes from the inverting output $\overline{Q}$ of the first monostable I1 which is normally "high". With both inputs "high", the output of gate G3 goes from "high" to "low". The inverting output $\overline{Q}$ of the first monostable I1 is also applied to the NAND gate G4 providing the signal $V_O$ controlling the status of the power dump stage 3. Thus in this initial phase, the output of gate G4 remains "low".

Since the output signal of the gate G3 goes from "high" to "low" a negative going pulse is applied to the negative trigger terminal −T of the second monostable I2 triggering a negative going pulse on its the inverting output $\overline{Q}$. Then monostable I2 stays in this state ("low") for a short period of time depending on the selected values of resistor R4 and capacitor C4, before triggering to the high state. When finally the inverting output $\overline{Q}$ of the second monostable I2 goes from "low" to "high" at the end of this short period of time, a positive going pulse is applied to the positive trigger terminal +T of the first monostable I1 which triggers a negative pulse on its inverting output $\overline{Q}$. Then the first monostable I1 remains in the "low" state for a much longer period of time depending again of the selected values of resistor R3 and capacitor C3. Since the inverting output $\overline{Q}$ of the first monostable I1 is directly connected to gate G4, the signal $V_O$ applied to the power dump stage 3 (output of gate G4) goes from "low" to "high". Thus the stage 3 turns to its ON state (MOSFET M10 conducting), removing the voltage source (solar array voltage) from the initial arcing event. When finally at the end of the longer period of time the state of the inverting output $\overline{Q}$ of the first monostable I1 goes from "low" to "high", the output of gate G4 goes from "high" to "low" turning the power dump stage 3 to its OFF state (no dumping).

It should be noted that thanks to gates G1 and G4, the arc-quenching circuit 3 operates in parallel to the normal DoD regulation signal, gate G1 preventing the circuit from triggering under nominal dump control conditions.

The monostables I1 and I2 can be implemented by a single dual monostable CMOS integrated circuit such as the CD4098. Equally, the four NAND gates G1-G4 can be implemented by a single integrated circuit such as the CD4093.

Figure 5:
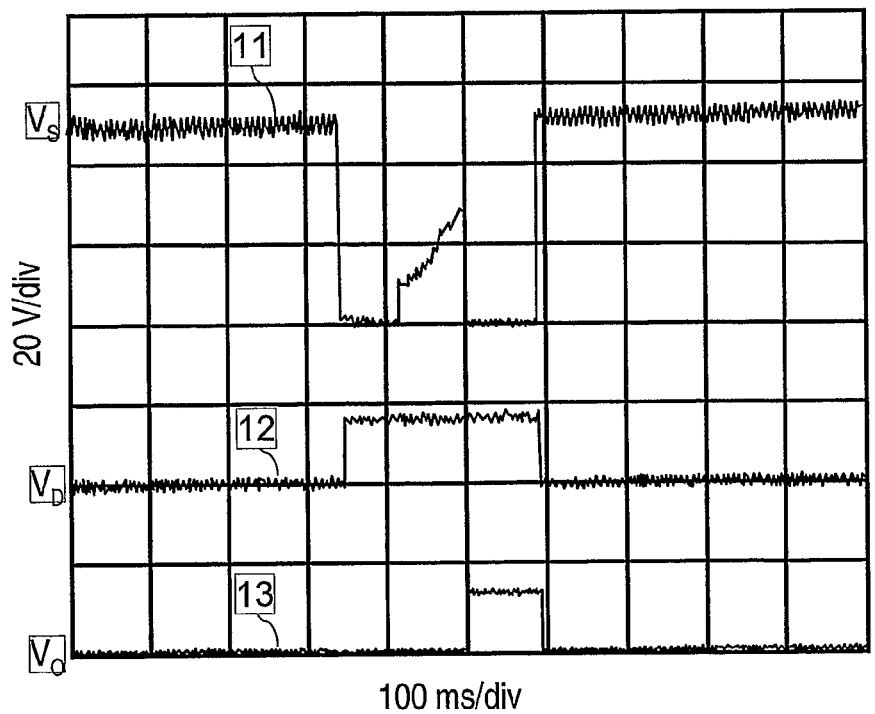
FIGS. 5 to 9 illustrate with curves the operation of the protection device shown in FIG. 2.

FIG. 5 illustrates the operation of the above-described protection device. In this figure, the upper trace 11 displays as a function of time the solar array voltage $V_S$ which falls to 0 V as a direct shortcut is created on arcing contact points. When these points are subsequently opened due to evaporation of short circuit material, trace 11 then presents a rising edge depicting the initiation of an arc. The middle trace 12 displays as a function of time the output voltage $V_D$ of the voltage drop detection circuit 1. As soon as the solar array voltage drop has been detected, the voltage drop detection signal presents a rising edge activating the arc-quenching circuit 2. The lower trace 13 shows as a function of time the output signal $V_O$ of the arc-quenching circuit applied to the power dump stage 3. The initial delay from voltage drop detection during which the arc-quenching circuit does not react should be long enough to successfully clear any shortcut conductive material, but not too large since the longer the arc goes on, the greater will be the damage on the arcing site. This initial delay is followed by an arc-quenching pulse which extinguishes the arc as shown by upper trace 11, by clamping the solar array voltage to near 0 V (the power dump stage 3 is set to its ON state). This arc-quenching pulse has to last some time in order to allow the plasma to disperse and the arcing site to cool down so as to prevent the arc from re-establishing. At the end of the arc-quenching pulse the quenching-circuit 2 sets the power dump stage 3 to its OFF state. Thus the solar voltage is re-established and the output voltage of the voltage drop detection circuit 1 returns to 0 V.

In the example of FIG. 5, the initial delay from the voltage drop detection to the arc-quenching pulse generation is set to 150 ms whereas the arc-quenching pulse width is limited to 90 ms, these values being obtained with R3=R4=1 MΩ, C3=0.22 µF and C4=0.47 µF.

Figure 6:
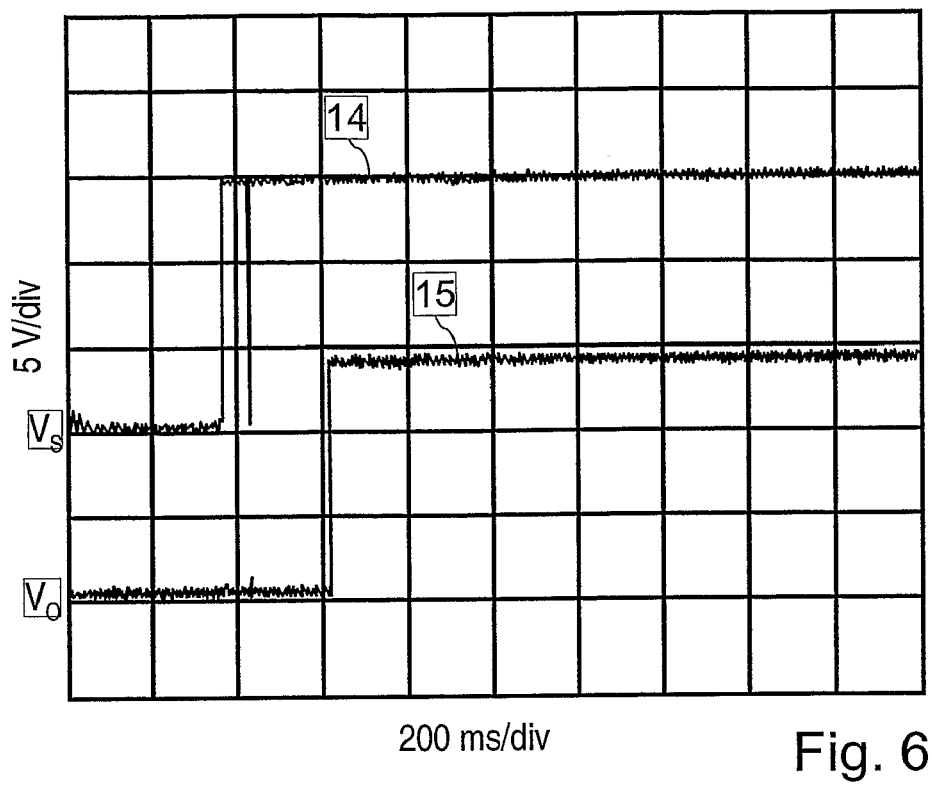
Figure 7:
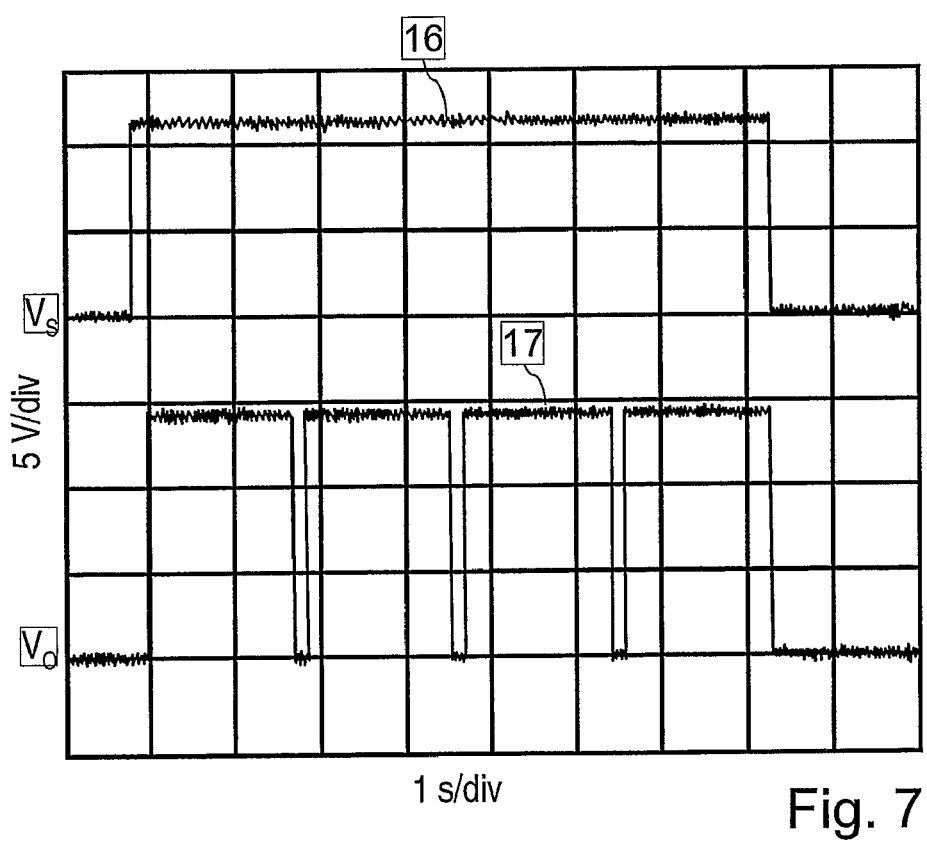

FIGS. 6 and 7 show the initial delay and arc-quenching pulse delay produced by the arc-quenching circuit 2. In these Figures the upper traces 14, 16 and lower traces 15, 17 show as a function of time respectively the output voltage $V_D$ of the voltage drop detection circuit 1, and the output voltage $V_O$ of the arc-quenching circuit 2, the time scale being set to 200 ms in FIG. 6 and 1 s in FIG. 7. In the example of FIGS. 6 and 7, the initial delay from the voltage drop detection to the arc-quenching pulse generation is set to 170 ms whereas the arc-quenching pulse width is set to 1.7 s, these values being obtained with R3=R4=1 MΩ, C3=4.7 µF and C4=0.47 µF.

FIG. 7 shows that if the solar array voltage $V_S$ stays "low" after the first arc-quenching pulse, as detected by the voltage drop detection circuit 1, a new quenching cycle starts with an initial delay followed by an arc-quenching pulse. This quenching cycle is repeated as long as the voltage drop detection circuit 1 detects a voltage drop between the solar array voltage $V_S$ and the bus voltage $V_B$.

Figure 8:
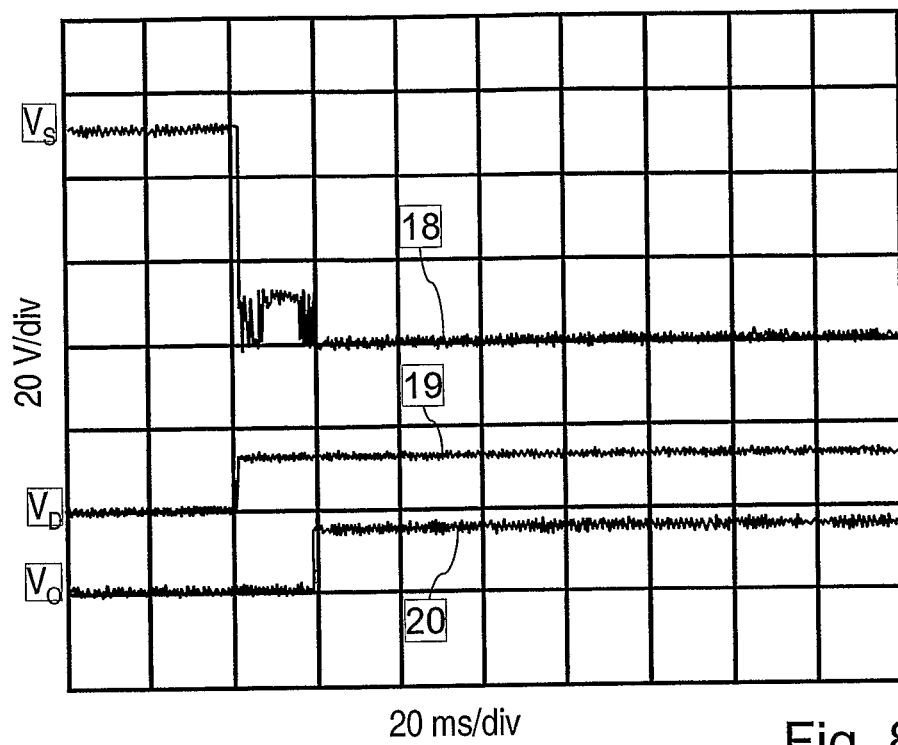
Figure 9:
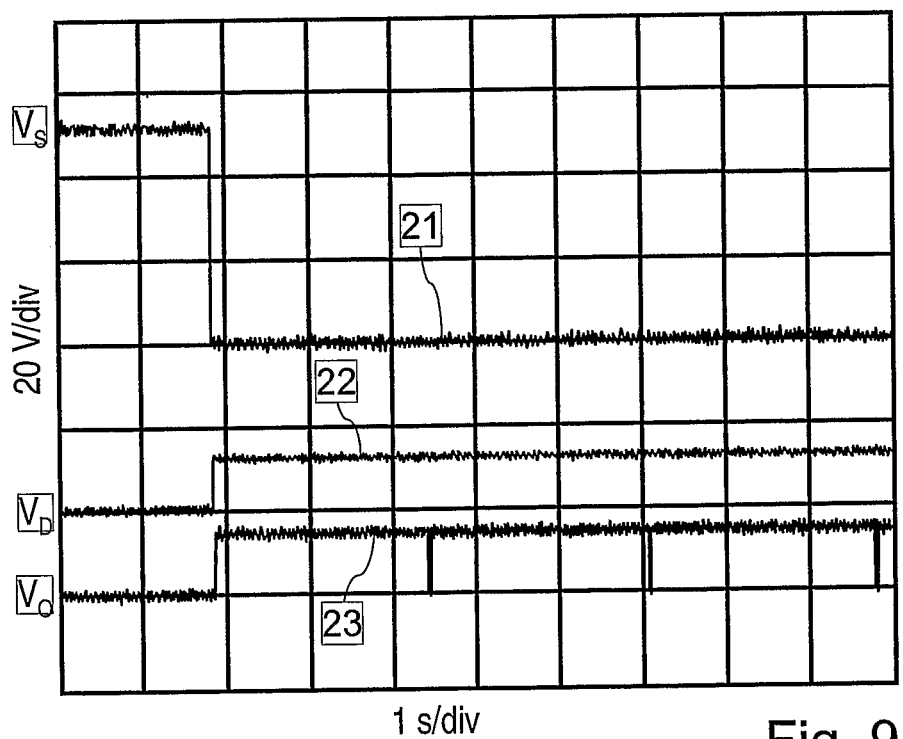

FIGS. 8 and 9 show the initial delay and arc-quenching pulse delay produced by the arc-quenching circuit 2. In these Figures the upper traces 18, 21 show as a function of time the solar array voltage $V_S$. The middle traces 19, 22 show as a function of time the output signal $V_D$ of the voltage drop detection circuit 1. The lower traces 20, 22 show as a function of time the output voltage $V_O$ of the arc-quenching circuit 2, the time scale being set to 20 ms in FIG. 8 and 1 s in FIG. 9. In the example of FIGS. 8 and 9, the initial delay from the voltage drop detection to the arc-quenching pulse generation is set to 19 ms whereas the arc-quenching pulse width is set to 2.6 s, these values being obtained with R3=R4=1 MΩ, C3=6.8 µF and C4=0.1 µF. Again FIG. 9 shows that a new quenching cycle is started as long as the solar array voltage $V_S$ (as detected by the voltage drop detection circuit 1) remains low after an arc-quenching pulse.

The preferred values for the initial delay and the arc-quenching pulse width are respectively 19 ms and 1.7 s which are obtained with R3=R4=1 MΩ, C3=4.7 µF and C4=0.1 µF.

The invention claimed is:

1. A device for protecting solar array panels and control equipment supplying a main power bus against arcing events, said control equipment comprising a regulator for controlling a solar array voltage ($V_s$) including a power dump stage for shunting said solar array voltage as a function of a control signal (DoD), said device comprising:
   a voltage drop detection circuit for detecting a voltage drop in the solar array voltage provided by said solar array panels, said voltage drop detection circuit generating a voltage drop detection signal ($V_D$), and
   an arc-quenching circuit comprising means for generating an output signal ($V_o$) which is applied as said control signal (DoD) to the power dump stage so as to shunt said solar array voltage ($V_s$) when a voltage drop is detected by said voltage drop detection circuit.

2. The device according to claim 1, wherein said arc-quenching circuit further comprises means for shaping said output signal ($V_o$) so as to provide a short initial delay without any action subsequent to a voltage drop detection provided by said voltage drop detection signal ($V_D$), and after said initial delay an arc-quenching pulse which triggers said power dump stage so as to shunt said solar array voltage ($V_s$).

3. The device according to claim 2, wherein said arc-quenching circuit further comprises a first monostable controlling said initial delay and a second monostable controlling a width of said arc-quenching pulse.

4. The device according to claim 2, wherein said initial delay is set to about 19 ms and said arc-quenching pulse has a width set to about 1.7 s.

5. The device according to claim 2, wherein said arc-quenching circuit further comprises means for starting a new quenching cycle including said initial delay followed by said arc-quenching pulse as long as the voltage drop detection circuit detects a voltage drop in said solar array voltage ($V_s$)

6. The device according to claim 1, wherein said voltage drop detection circuit comprises means for comparing said solar array voltage ($V_s$) to a main bus voltage ($V_B$)

7. The device according to claim 1, wherein said arc-quenching circuit further comprises means for combining said control signal (DoD) and said output signal ($V_o$) before being applied to the power dump stage.

* * * * *